United States Patent
Kyle et al.

(10) Patent No.: US 9,521,757 B2
(45) Date of Patent: Dec. 13, 2016

(54) SYSTEMS AND METHODS FOR LOADING OF A COMPONENT

(71) Applicant: Dell Products L.P., Round Rock, TX (US)

(72) Inventors: Lawrence A. Kyle, Salado, TX (US); Robert Johnson, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 204 days.

(21) Appl. No.: 14/595,987

(22) Filed: Jan. 13, 2015

(65) Prior Publication Data

US 2016/0205784 A1 Jul. 14, 2016

(51) Int. Cl.
*H05K 1/02* (2006.01)
*H05K 3/30* (2006.01)
*H05K 7/12* (2006.01)

(52) U.S. Cl.
CPC ............ *H05K 3/301* (2013.01); *H05K 1/0201* (2013.01); *H05K 1/0204* (2013.01); *H05K 7/12* (2013.01)

(58) Field of Classification Search
CPC ........ H05K 3/301; H05K 7/12; H05K 1/0204; H05K 1/0201
USPC ............................................ 361/679.46–804
See application file for complete search history.

(56) References Cited

U.S. PATENT DOCUMENTS

| | | | | |
|---|---|---|---|---|
| 2004/0085735 A1* | 5/2004 | Liu | ...................... | H01L 23/4006 361/704 |
| 2004/0252462 A1* | 12/2004 | Cromwell | ........... | H01L 23/4093 361/719 |
| 2008/0310118 A1* | 12/2008 | Brocklesby | ........... | F16B 5/0208 361/719 |
| 2009/0021917 A1* | 1/2009 | Floyd | .................. | H01L 23/4093 361/719 |
| 2010/0130030 A1* | 5/2010 | Liao | ...................... | H05K 7/1053 439/68 |
| 2010/0330824 A1* | 12/2010 | Ulen | ..................... | H05K 7/1053 439/73 |
| 2011/0273831 A1* | 11/2011 | Kyle | ....................... | G06F 1/181 361/679.31 |
| 2014/0071647 A1* | 3/2014 | Bridges | ................ | H05K 7/1007 361/783 |
| 2014/0162473 A1* | 6/2014 | Aoki | ...................... | H05K 3/301 439/68 |

* cited by examiner

*Primary Examiner* — Anthony Haughton
*Assistant Examiner* — Yahya Ahmad
(74) *Attorney, Agent, or Firm* — Jackson Walker L.L.P.

(57) ABSTRACT

In a component loading system, a circuit board may include a socket, a first plurality of holes, and a second plurality of holes. A frame may include two opposing sidewalls each substantially perpendicular to a surface of the circuit board and coupled to one another via a plate, a plurality of threaded channels, each channel adjacent to one of the two opposing sidewalls and located between the two opposing sidewalls, and a third plurality of holes. A backing plate may include a plurality of heat dissipater mounting posts and a fourth plurality of holes. A plurality of second fasteners may each be mechanically engaged to a respective one of the plurality of threaded channels and passing through a respective one of the second plurality of holes to mechanically secure the frame and backplate on opposite sides of the circuit board.

20 Claims, 12 Drawing Sheets

SYSTEMS AND METHODS FOR LOADING OF A COMPONENT

TECHNICAL FIELD

The present disclosure relates to modular information handling systems. More specifically, embodiments of the disclosure provide systems and methods for providing for mechanical loading of a component, for example mechanical loading of a processor to a socket.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often include processors for use in processing, storing, and communicating information. A processor may be coupled to other components in an information handling system through a socket mounted to a board in the information handling system. The processors typically include a plurality of pins that must be mate with the socket in order to allow the processor to function.

Conventional systems and methods for mating processors with sockets include providing a board defining mounting holes adjacent a socket and then positioning fasteners corresponding to the mounting holes in a loading mechanism and the board in order to mount the loading mechanism to the board adjacent a socket. As processors and board layouts become more complex and dense (e.g., in terms of trace routing volume), the volume and board space adjacent the socket becomes increasingly valuable. By defining six to eight holes in the board in order to mount the loading mechanism and heatsink, conventional processor loading systems use up valuable volume and board space adjacent the processor that could be utilized to, for example, route traces or position other components.

SUMMARY

In accordance with the teachings of the present disclosure, the disadvantages and problems associated with loading of a component to a circuit board may be reduced or eliminated.

In accordance with embodiments of the present disclosure, a component loading system may include a circuit board, a frame, a backing plate, a plurality of first fasteners, and a plurality of second fasteners. The circuit board may include a socket, a first plurality of holes, and a second plurality of holes. The frame may include two opposing sidewalls each substantially perpendicular to a surface of the circuit board and coupled to one another via a plate, a plurality of threaded channels, each channel adjacent to one of the two opposing sidewalls and located between the two opposing sidewalls, and a third plurality of holes. The backing plate may include a plurality of heat dissipater mounting posts and a fourth plurality of holes. The plurality of first fasteners may each be mechanically engaged to a respective heat dissipater mounting post passing through a respective one of the third plurality of holes and a respective one of the first plurality of holes to mechanically secure the frame and backplate on opposite sides of the circuit board. The plurality of second fasteners may each be mechanically engaged to a respective one of the plurality of threaded channels and passing through a respective one of the second plurality of holes to mechanically secure the frame and backplate on opposite sides of the circuit board.

In accordance with these and other embodiments of the present disclosure, a method may include providing a circuit board, providing a frame, providing a backing plate, and mechanically securing the frame and the backplate on opposite sides of the circuit board. The circuit board may include a socket, a first plurality of holes, and a second plurality of holes. The frame may include two opposing sidewalls each substantially perpendicular to a surface of the circuit board and coupled to one another via a plate, a plurality of threaded channels, each channel adjacent to one of the two opposing sidewalls and located between the two opposing sidewalls, and a third plurality of holes. The backing plate may include a plurality of heat dissipater mounting posts and a fourth plurality of holes. The frame and the backplate may be mechanically secured on opposite sides of the circuit board via a plurality of first fasteners each mechanically engaged to a respective heat dissipater mounting post passing through a respective one of the third plurality of holes and a respective one of the first plurality of holes to mechanically secure the frame and backplate on opposite sides of the circuit board and a plurality of second fasteners each mechanically engaged to a respective one of the plurality of threaded channels and passing through a respective one of the second plurality of holes to mechanically secure the frame and backplate on opposite sides of the circuit board.

In accordance with these and other embodiments of the present disclosure, an information handling system may include circuit board, a memory, a frame, a backing plate, a plurality of first fasteners, and a plurality of second fasteners. The circuit board may include a socket, a first plurality of holes, and a second plurality of holes. The memory may be communicatively coupled to the socket. The frame may include two opposing sidewalls each substantially perpendicular to a surface of the circuit board and coupled to one another via a plate, a plurality of threaded channels, each channel adjacent to one of the two opposing sidewalls and located between the two opposing sidewalls, and a third plurality of holes. The backing plate may include a plurality of heat dissipater mounting posts and a fourth plurality of holes. The plurality of first fasteners may each be mechanically engaged to a respective heat dissipater mounting post passing through a respective one of the third plurality of holes and a respective one of the first plurality of holes to mechanically secure the frame and backplate on opposite sides of the circuit board. The plurality of second fasteners may each be mechanically engaged to a respective one of the plurality of threaded channels and passing through a respective one of the second plurality of holes to mechanically secure the frame and backplate on opposite sides of the circuit board.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-8B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Figure 1:
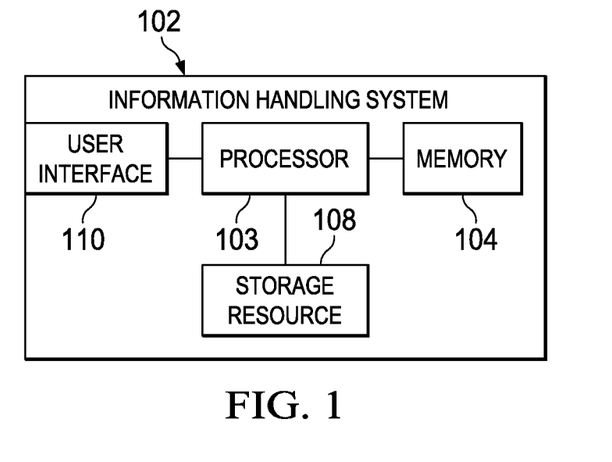
FIG. 1 illustrates a block diagram of selected components of an example information handling system, in accordance with embodiments of the present disclosure.

FIG. 1 illustrates a functional block diagram of selected components of an example information handling system 102, in accordance with embodiments of the present disclosure. In some embodiments, information handling system 102 may be a personal computer (e.g., a desktop computer or a portable computer). In other embodiments, information handling system 102 may comprise a storage server for archiving data.

As depicted in FIG. 1, information handling system 102 may include a processor 103, a memory 104 communicatively coupled to processor 103, a storage resource 108 communicatively coupled to processor 103, and a user interface 110 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104, storage resource 108, and/or another component of information handling system 102.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 102 is turned off.

Storage resource 108 may include a system, device, or apparatus configured to store data. Storage resource 108 may include one or more hard disk drives, magnetic tape libraries, optical disk drives, magneto-optical disk drives, solid state storage drives, compact disk drives, compact disk arrays, disk array controllers, and/or any other systems, apparatuses or devices configured to store data. In certain embodiments, storage resource 108 may include one or more storage enclosures configured to hold and/or power one or more of such devices. In the embodiments represented by FIG. 1, storage resource 108 may reside within information handling system 102. However, in other embodiments, storage resource 108 may reside external to information handling system 102 (e.g., may be coupled to information handling system 102 via a network).

User interface 110 may comprise any instrumentality or aggregation of instrumentalities by which a user may interact with information handling system 102. For example, user interface 110 may permit a user to input data and/or instructions into information handling system 102, and/or otherwise manipulate information handling system 102 and its associated components. User interface 110 may also permit information handling system 102 to communicate data to a user, e.g., by way of a display device.

In addition to processor 103, memory 104, storage resource 108, and user interface 110, information handling system 102 may include one or more other information handling resources. Such an information handling resource may include any component system, device or apparatus of an information handling system, including without limitation, a processor, bus, memory, I/O device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

Figure 2:
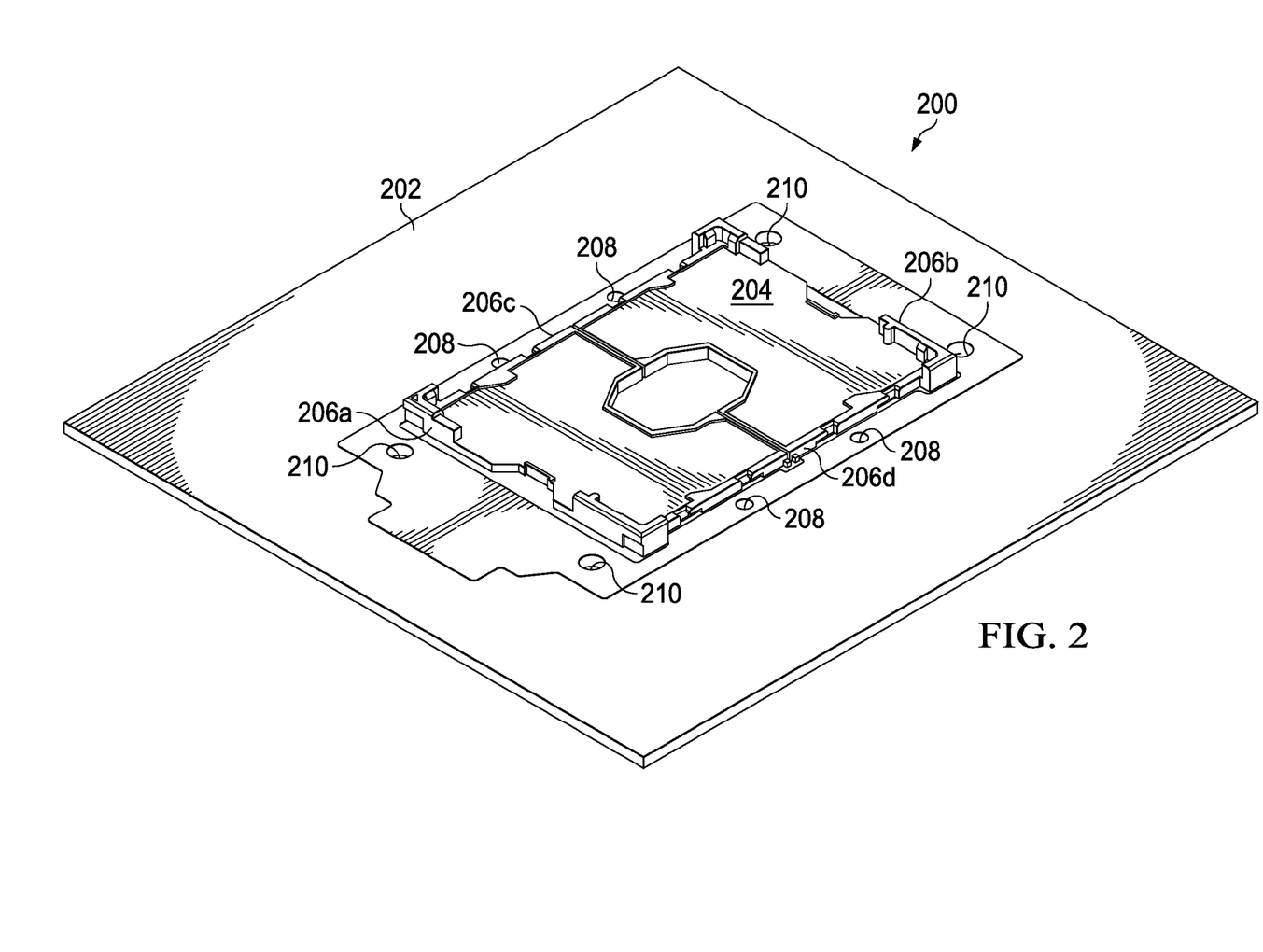
FIG. 2 illustrates a perspective view of a portion of a processor loading system, in accordance with embodiments of the present disclosure.

FIG. 2 illustrates a perspective view of a portion 200 of a processor loading system, in accordance with embodiments of the present disclosure. In some embodiments of the present disclosure, the processor loading system portion 200 may be housed in a chassis or other housing for housing components of information handling system 102 described above with reference to FIG. 1. As shown in FIG. 2, processor loading system portion 200 may comprise a circuit board 202 having a socket 204 mounted thereon. Socket 204 may include a front edge 206a, a rear edge 206b located opposite socket 204 from front edge 206a, and a pair of opposing side edges 206c and 206d that extend between front edge 206a and rear edge 206b. In some embodiments, socket 204 may be electrically coupled to information handling resources, including one or more of memory 104, storage resource 108, and user interface 110, via conductive traces formed in circuit board 202. A plurality of pins may be located on socket 204 within an area defined by front edge 206a, rear edge 206b, and side edges 206c and 206d. Socket 204 may also include one or more holes 208 near each of side edges 206c and 206d for mechanically fastening a frame (e.g., frame 300 of FIG. 3) to a backing plate (e.g., backing plate of FIG. 4) on opposite sides of circuit board 202, as described in greater detail below with reference to FIGS. 5A and 5B. In addition, circuit board 202 may include one or more holes 210 outside of an area defined by front edge 206a, rear edge 206b, and side edges 206c and 206d which may also aid in mechanically fastening a frame (e.g., frame 300 of FIG. 3) to a backing plate (e.g., backing plate of FIG. 4) on opposite sides of circuit board 202 and allowing for passage from the backing plate through circuit board 202 of heat dissipater coupling posts (e.g., heat dissipater coupling posts 402 of FIG. 4).

Figure 3:
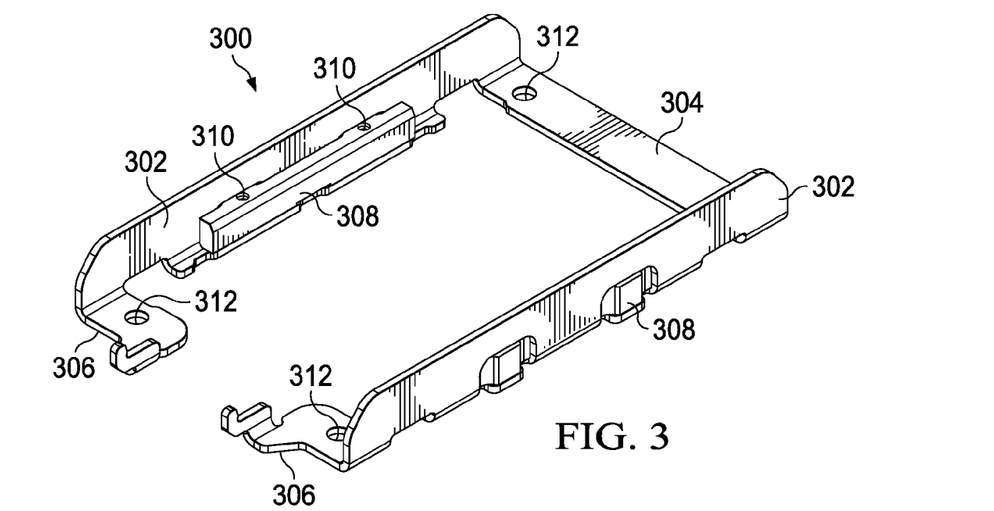
FIG. 3 illustrates a perspective view of a frame of a processor loading system, in accordance with embodiments of the present disclosure.

FIG. 3 illustrates a perspective view of a frame 300 of a processor loading system, in accordance with embodiments of the present disclosure. As shown in FIG. 3, frame 300 may include a back-side plate 304, two opposing sidewalls 302 mechanically coupled to back-side plate 304 and each substantially perpendicular to back-side plate 304, and flanges 306 extending from each of sidewall 302 opposite frame 300 from back-side plate 304. Coupled to each sidewall 302 and within an area defined by back-side plate 304, sidewalls 302, and flanges 306 may be a bracket 308 having one or more threaded channels 310. Each threaded channel 310 may be configured to receive a corresponding fastener (e.g., fastener 504 of FIGS. 5A and 5B) in order to mechanically fasten frame 300 to a backing plate (e.g., plate 400 of FIG. 4) on a side of circuit board 202 opposite of that from which frame 300 is located. In addition, circuit board 202 may include one or more holes 312 formed in one or more of back-side plate 304 and flanges 306, which may allow for passage from the backing plate through circuit board 202 and frame 300 of heat dissipater coupling posts (e.g. heat dissipater coupling posts 402 of FIG. 4) and also facilitate fastening frame 300 of FIG. 3 to the backing plate (e.g., via fasteners 502 of FIG. 2 configured to fasten to heat dissipater coupling posts 402 of FIG. 4).

Figure 4:
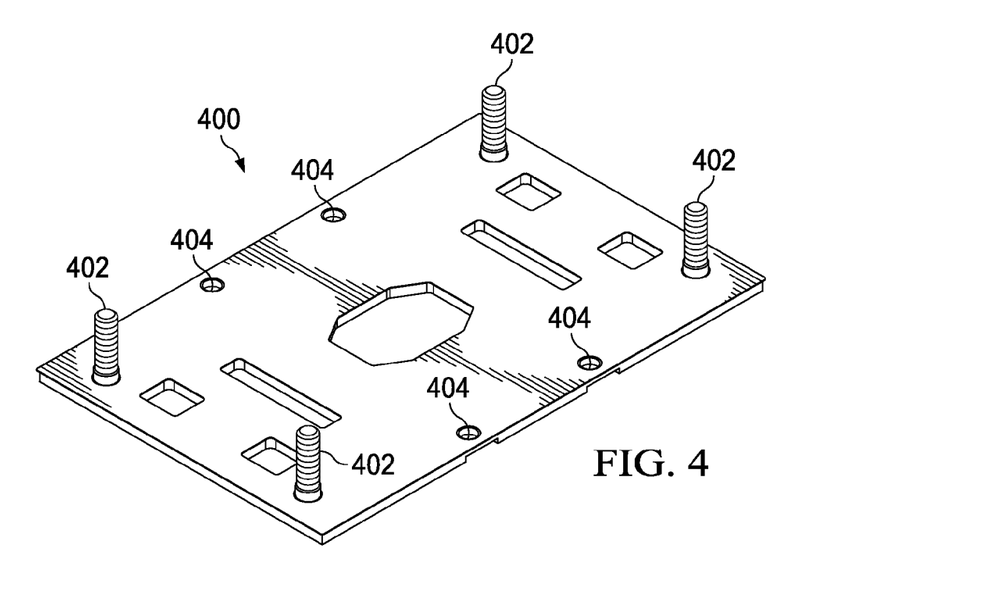
FIG. 4 illustrates a perspective view of a backing plate of a processor loading system, in accordance with embodiments of the present disclosure.

FIG. 4 illustrates a perspective view of a backing plate 400 of a processor loading system, in accordance with embodiments of the present disclosure. As shown in FIG. 4, backing plate 400 may comprise a substantially planar plate of any suitable material and may have one or more heat dissipater coupling posts 402 all extending from one side of backing plate 400. In some embodiments, each heat dissipater coupling post 402 may be threaded in order to mechanically couple to one or more corresponding fasteners (e.g., fastener 502 of FIGS. 5A and 5B, spring-loaded fastener 606 of FIGS. 6A-6C, etc.) in order to mechanically couple frame 300 to backing plate 400 and/or mechanically couple a processor/heat dissipater module (e.g., processor/heat dissipater module 600 of FIGS. 6A-6C) to the processor loading system, as described in greater detail below. Backing plate 404 may also include openings 404 for receiving fasteners (e.g., fasteners 504 of FIGS. 5A and 5B).

Figure 5A:
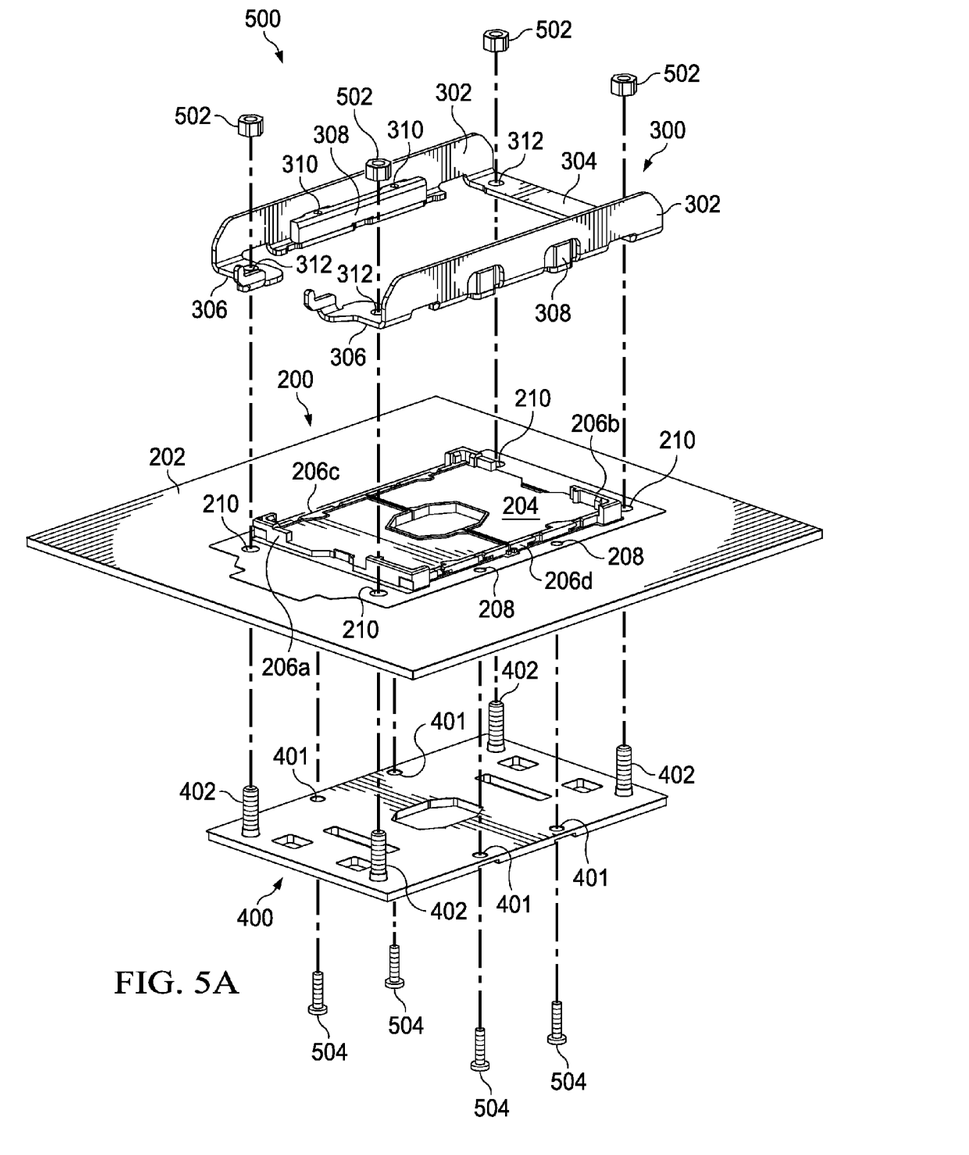
FIG. 5A illustrates an exploded perspective view of the various components of a processor loading system, in accordance with embodiments of the present disclosure.
Figure 5B:
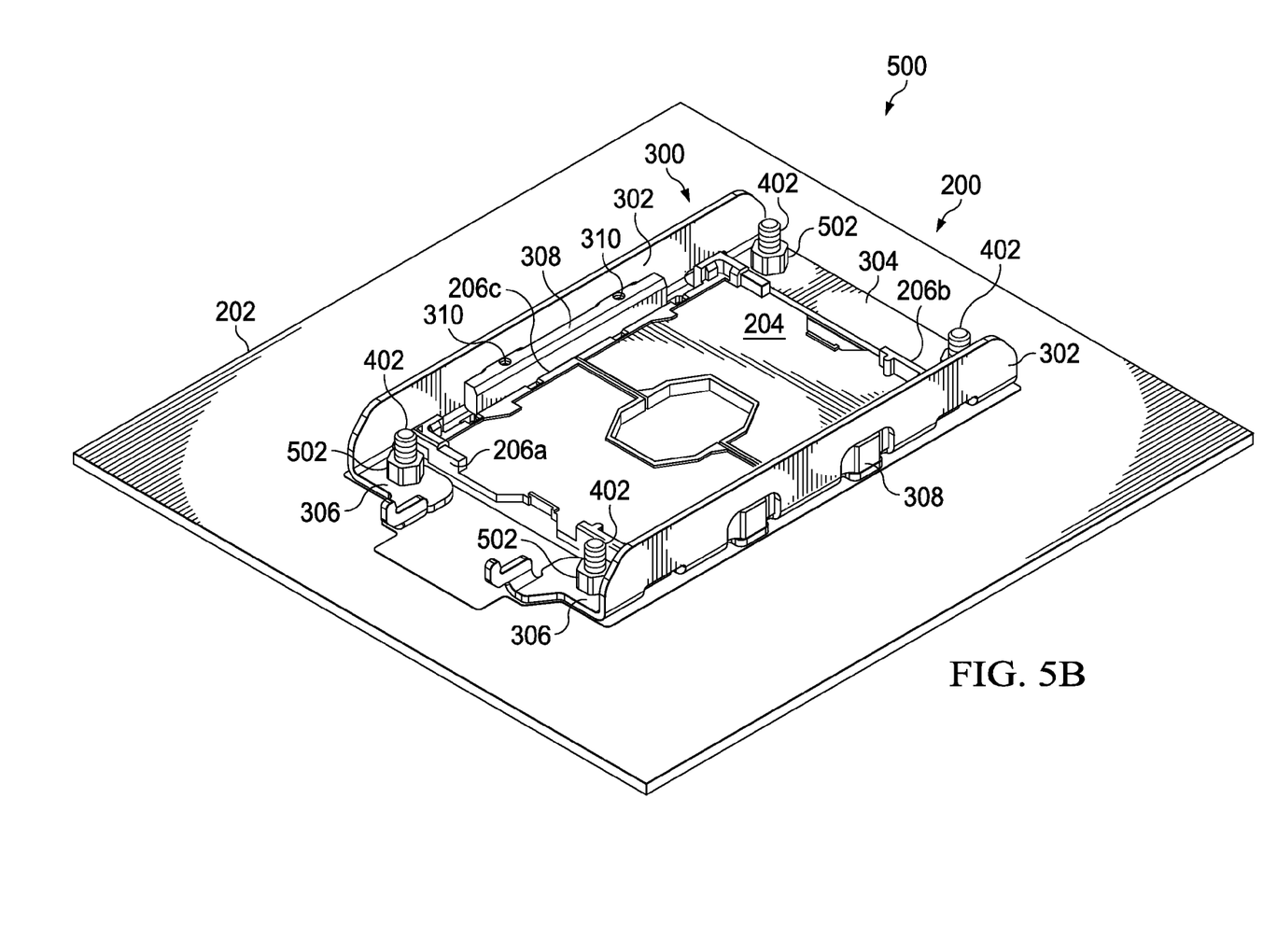
FIG. 5B illustrates a perspective view of the various components of a processor loading system assembled together, in accordance with embodiments of the present disclosure.

FIG. 5A illustrates an exploded perspective view of the various components of a processor loading system 500 comprising processor loading system portion 200, frame 300, and backing plate 400, in accordance with embodiments of the present disclosure and FIG. 5B illustrates a perspective view of the various components of a processor loading system assembled together, in accordance with embodiments of the present disclosure, thus demonstrating a method for assembling processor loading system 500. As shown in FIGS. 5A and 5B, each heat dissipater coupling post 402 may pass through a corresponding hole 210 of circuit board 202 and hole 312 of frame 300 and mechanically couple with a corresponding fastener 502 in order to mechanically secure each of frame 300 and backing plate 400 to opposite sides of circuit board 202. Each fastener 502 may have a threaded opening (e.g., a nut or similar fastener) so that a substantial portion of its corresponding heat dissipater coupling post 402 pass through such fastener 502 and thus allowing fastener 502 to be adjacent or nearly adjacent to frame 300 when frame is mechanically secured to circuit board 202 and backing plate 400.

In addition, each fastener 504 (which may comprise a threaded screw) may pass through a corresponding opening 401 of backing plate 400, a corresponding opening 208 of socket 204, and engage with a threaded channel 310 of bracket 308 in order to further mechanically secure each of frame 300 and backing plate 400 to opposite sides of circuit board 202.

Figure 6A:
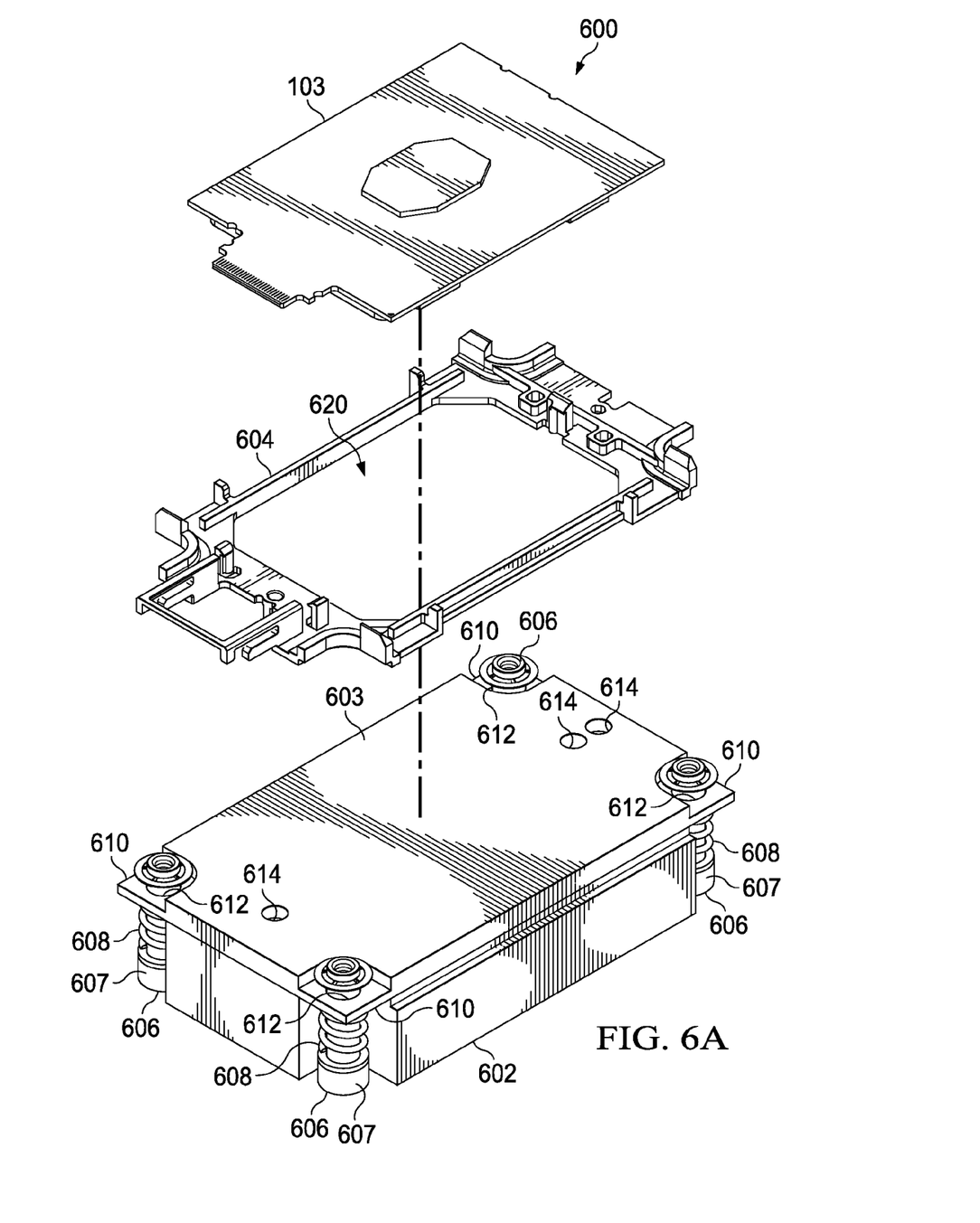
FIGS. 6A and 6B illustrate exploded perspective views of a processor/heat dissipater module, in accordance with embodiments of the present disclosure.
Figure 6B:
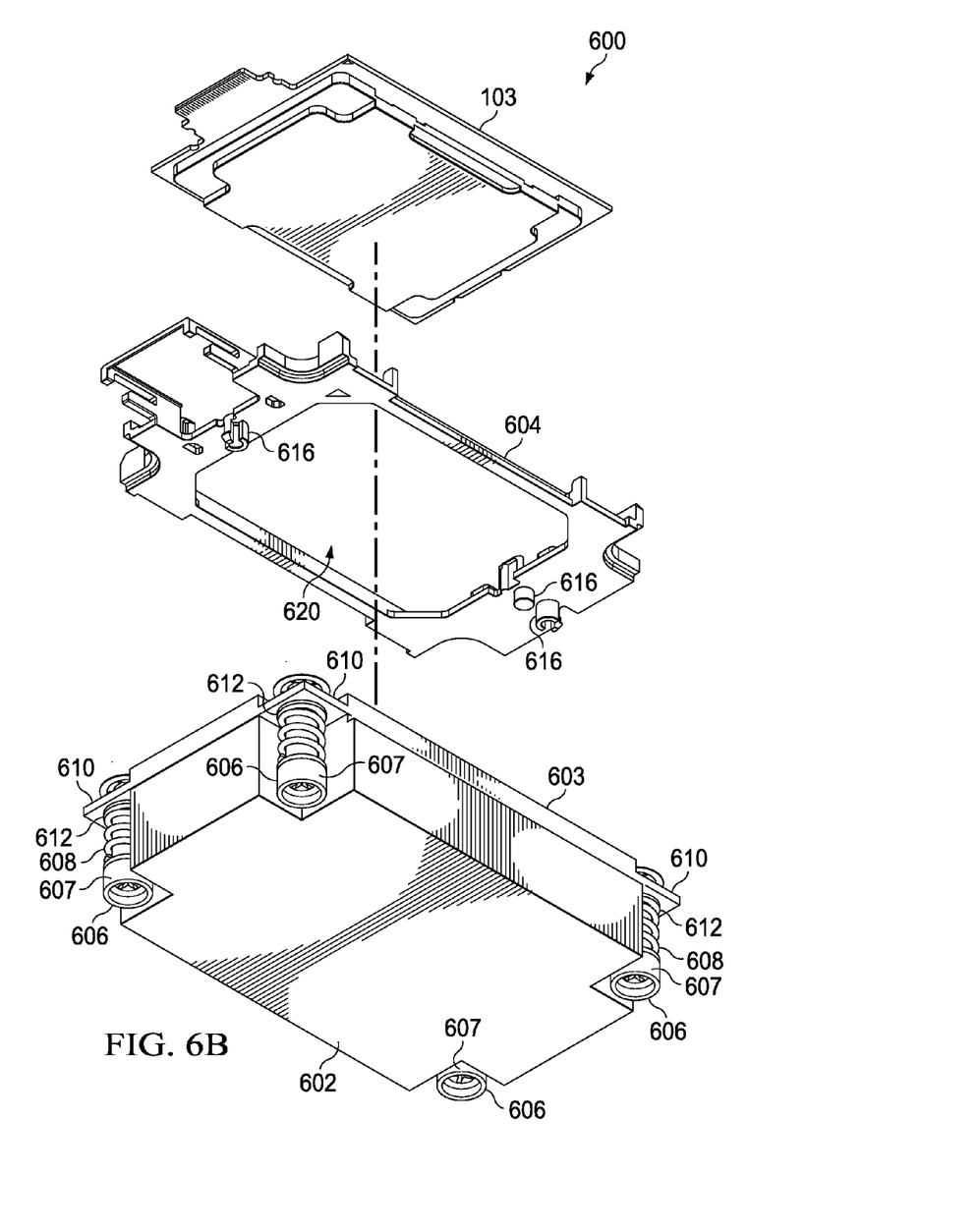
Figure 6C:
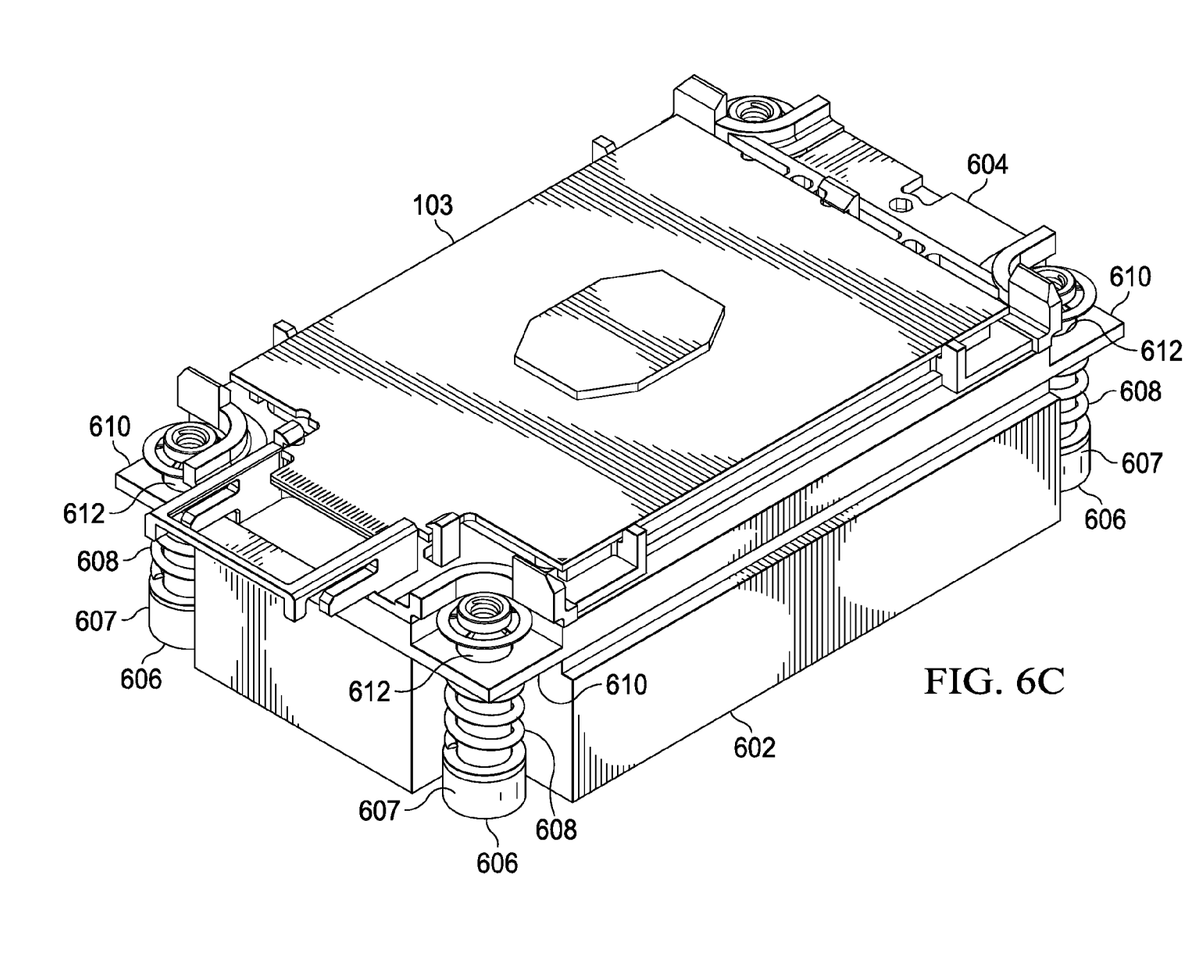
FIG. 6C illustrates a perspective view of an assembled processor/heat dissipater module, in accordance with embodiments of the present disclosure.

FIGS. 6A and 6B illustrate exploded perspective views of a processor/heat dissipater module 600, in accordance with embodiments of the present disclosure and FIG. 6C illustrates a perspective view of assembled processor/heat dissipater module 600, in accordance with embodiments of the present disclosure, thus demonstrating a method for assembling processor/heat dissipater module 600. As shown in FIGS. 6A-6C, processor/heat dissipater module 600 may comprise heat dissipater 602, interface bracket 604, and processor 103. Heat dissipater 602 may comprise a heatsink or other heat dissipation device. As shown in FIGS. 6A and 6B, heat dissipater 602 may include a surface 603 that may thermally couple to processor 103 directly or through a thermal interface material. Surface 603 may be generally flat and include one or more guide holes 614. Guide holes 614 may each be appropriately sized and shaped to engage with a corresponding guide post 616 of interface bracket 604, thus allowing interface bracket 604 to snap to or otherwise mechanically couple to heat dissipater 602. Interface bracket 604 may also include one or more mechanical features sized and shaped to mechanically engage with processor 103 such that processor 103 may snap to or otherwise mechanically couple to interface bracket 604, such that processor 103 may thermally couple to heat dissipater 602 via opening 620 of interface bracket 604.

As depicted in FIGS. 6A-6C, heat dissipater 602 may include proximate to each of one or more corners of surface 603 a flange 610 comprising an opening 612 for receiving a corresponding spring-loaded fastener 606 that is mechanically coupled to flange 610 via a spring 608 that has a spring force biasing a head 607 of fastener 606 and flange 610 away from one another.

Figure 7A:
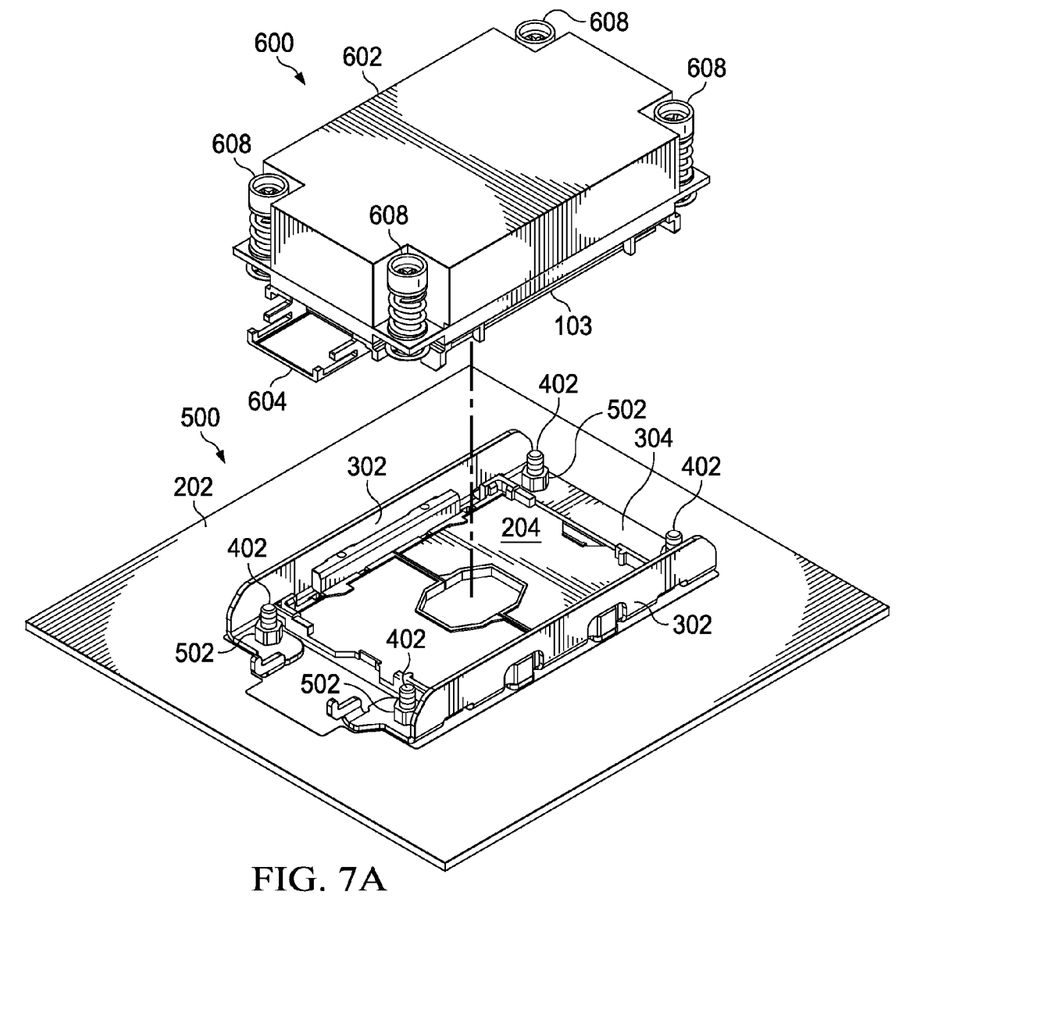
FIGS. 7A and 7B illustrate perspective views depicting engagement of a processor loading system with a processor/heat dissipater module, in accordance with embodiments of the present disclosure.
Figure 7B:
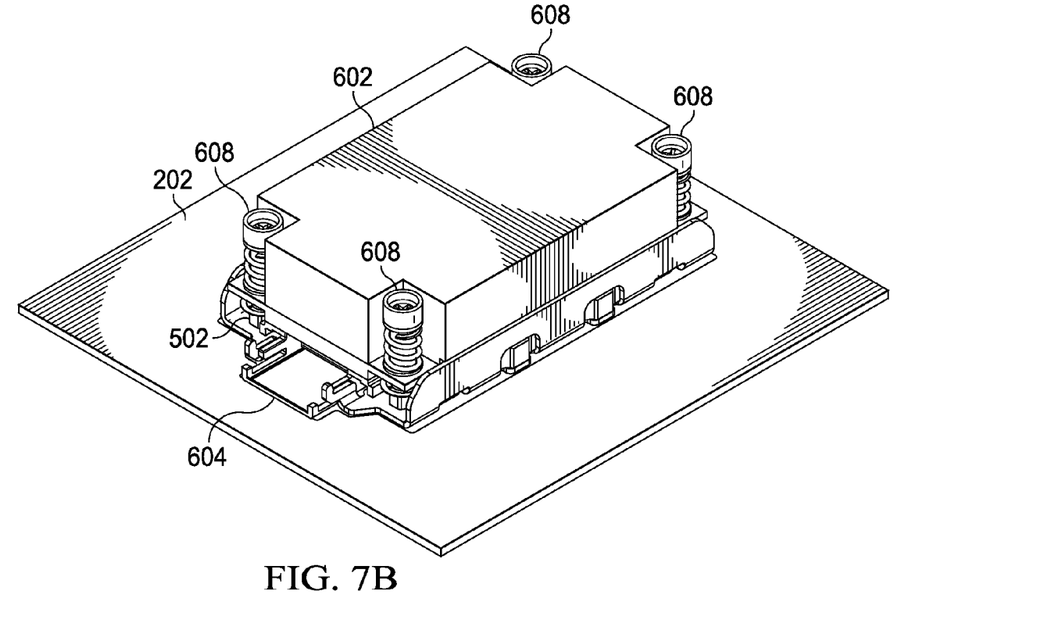

FIGS. 7A and 7B illustrate perspective views depicting engagement of a processor loading system 500 with a processor/heat dissipater module 600, in accordance with embodiments of the present disclosure. As shown in FIGS. 7A and 7B, assembled processor/heat dissipater module 600 may be lowered onto assembled processor loading system 500, wherein processor/heat dissipater module 600 may be guided into place by sidewalls 302 of frame 300, thus providing alignment of processor 103 with socket 204. Each of spring-loaded fasteners 606 may be tightened to a portion of a corresponding heat dissipater coupling post 402 extending above a fastener 502, thus mechanically securing processor/heat dissipater module 600 to processor loading system 500 and providing mechanical loading to further thermally couple processor 103 to heat dissipater 602 and to provide a loading force on processor 103 sufficient to electrically mate processor 103 with socket 204.

Figure 8A:
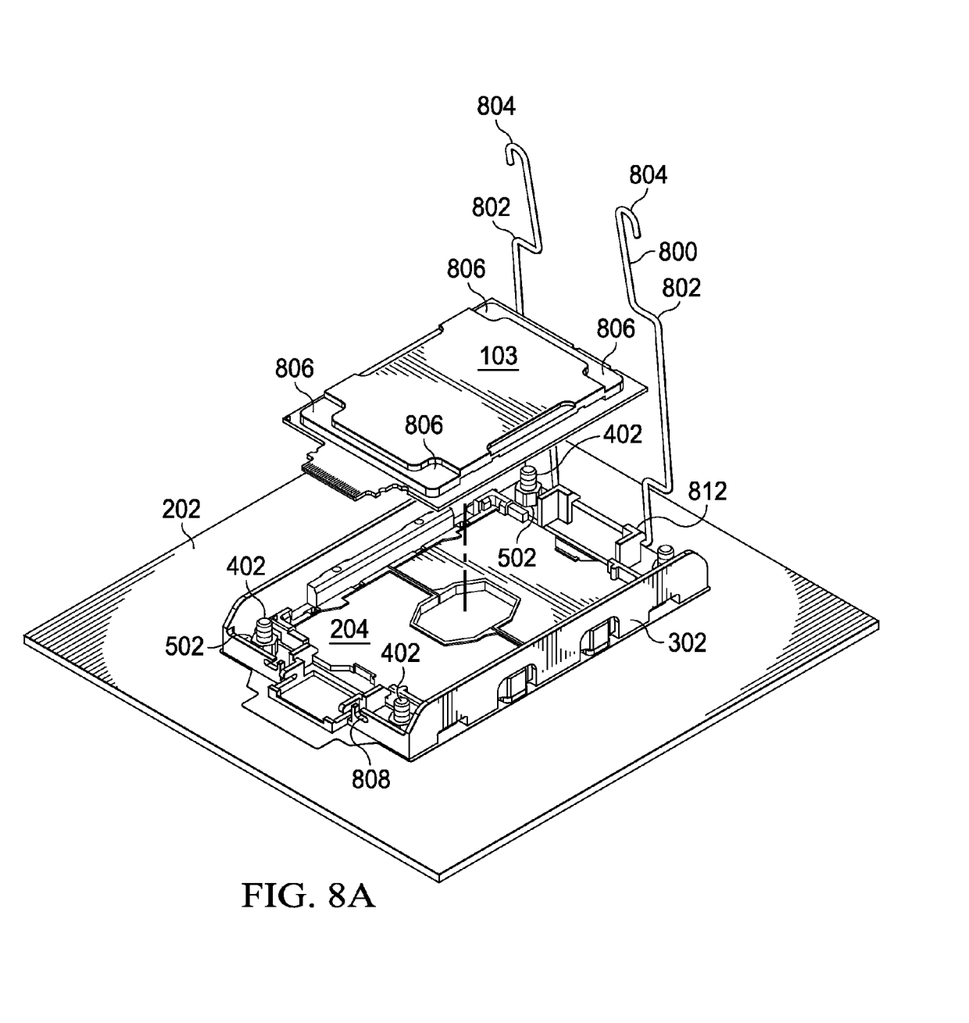
FIGS. 8A and 8B illustrate perspective views depicting engagement of a processor independent of a heat dissipater with a socket using a wire bale retention mechanism, in accordance with embodiments of the present disclosure.
Figure 8B:
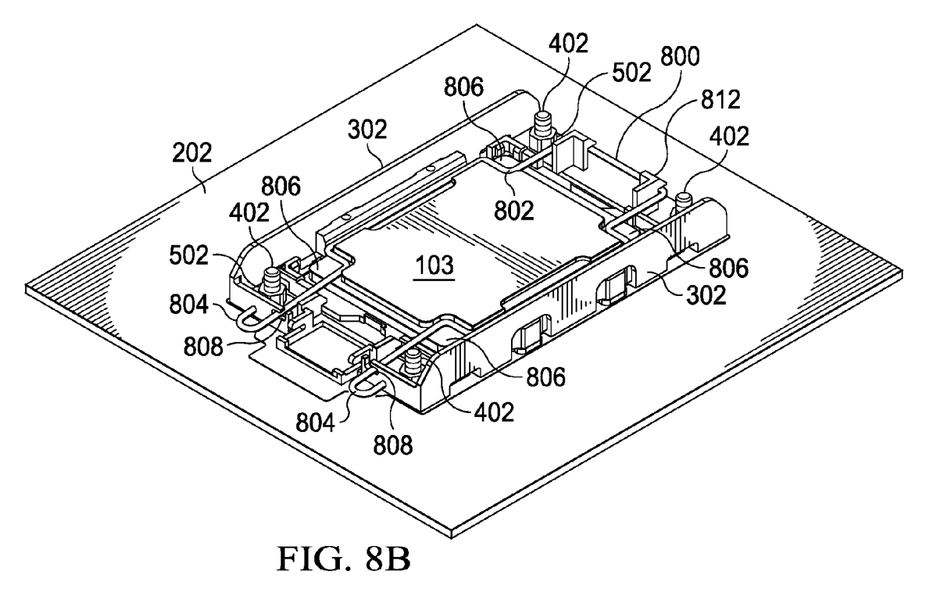

FIGS. 8A and 8B illustrate perspective views depicting engagement of a processor 103 independent of a heat dissipater with a socket using a wire bale retention mechanism 800, in accordance with embodiments of the present disclosure. As shown in FIGS. 8A and 8B, wire bale retention mechanism 800 may comprise a piece of metal wire or other material mechanically engaged with one or more pivots 812 of frame 300 which allow wire bale retention mechanism 800 to pivot from a first position shown in FIG. 8A to a second position shown in FIG. 8B. As shown in FIG. 8A, with wire bale retention mechanism 800 in the first position, processor 103 may be lowered into socket 204, and may be guided into socket 204 by sidewalls 302 or another feature of frame 300. Once processor 103 is engaged with socket 204, wire bale retention mechanism 800 may be translated to its second position, and curved features 802 of wire bale retention mechanism 800 may mechanically engage with extensions 806 of the package of processor 103 and hooked features 804 of wire bale retention mechanism 800 may engage with corresponding openings 808 of frame 300, thus providing a loading force on processor 103 sufficient to electrically mate processor 103 with socket 204. Once wire bale retention mechanism 800 has mechanically secured processor 103 with socket 204, heat dissipater 602 (without processor 103 or interface bracket 604 coupled thereto) may be lowered onto processor loading system 500, wherein heat dissipater 602 may be guided into place by sidewalls 302 of frame 300, thus providing alignment of processor 103 with socket 204, similar to as described above with reference to FIGS. 7A and 7B. Also as similarly described above with reference to FIGS. 7A and 7B, each of spring-loaded fasteners 606 may be tightened to a portion of a corresponding heat dissipater coupling post 402 extending above a fastener 502, thus mechanically securing heat dissipater 602 to processor loading system 500 and providing mechanical loading to thermally couple processor 103 to heat dissipater 602 and to further provide a loading force on processor 103 to electrically mate processor 103 with socket 204.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A component loading system, comprising:
a circuit board comprising:
    a socket;
    a first plurality of holes; and
    a second plurality of holes;
a frame comprising:
    two opposing sidewalls each substantially perpendicular to a surface of the circuit board and coupled to one another via a plate;
    a plurality of threaded channels, each channel adjacent to one of the two opposing sidewalls and located between the two opposing sidewalls; and
    a third plurality of holes;
a backing plate comprising:
    a plurality of heat dissipater mounting posts; and
    a fourth plurality of holes;
a plurality of first fasteners each mechanically engaged to a respective heat dissipater mounting post passing through a respective one of the third plurality of holes and a respective one of the first plurality of holes to mechanically secure the frame and backplate on opposite sides of the circuit board; and
a plurality of second fasteners each mechanically engaged to a respective one of the plurality of threaded channels and passing through a respective one of the second plurality of holes to mechanically secure the frame and backplate on opposite sides of the circuit board.

2. The component loading system of claim 1, the sidewalls arranged in relation to each other and the socket in order to mechanically guide a package comprising a processor into the component loading system.

3. The component loading system of claim 2, wherein the package comprises a processor/heat dissipater module comprising a processor mechanically coupled to a heat dissipater.

4. The component loading system of claim 1, wherein each of the plurality of heat dissipater mounting posts are configured to engage with a respective fastener of a heat dissipater.

5. The component loading system of claim 1, further comprising a heat dissipater comprising a plurality of spring-loaded fasteners each mechanically coupled to a respective one of the plurality of heat dissipater mounting posts, the spring-loaded fasteners each having a spring force providing mechanical loading for thermally coupling the heat dissipater to a processor electrically coupled to the socket.

6. The component loading system of claim 5, the heat dissipater integral to a processor/heat dissipater module further comprising a processor mechanically coupled to the heat dissipater, and the spring-loaded fasteners each having a spring force providing mechanical loading for electrically mating the processor to the socket.

7. The component loading system of claim 5, wherein the processor is mechanically secured to the socket by a wire bale retention mechanism.

8. A method comprising:
providing a circuit board comprising:
    a socket;
    a first plurality of holes; and
    a second plurality of holes;
providing a frame comprising:
    two opposing sidewalls each substantially perpendicular to a surface of the circuit board and coupled to one another via a plate;
    a plurality of threaded channels, each channel adjacent to one of the two opposing sidewalls and located between the two opposing sidewalls; and
    a third plurality of holes;
providing a backing plate comprising:
    a plurality of heat dissipater mounting posts; and
    a fourth plurality of holes; and
mechanically securing the frame and the backplate on opposite sides of the circuit board via:
    a plurality of first fasteners each mechanically engaged to a respective heat dissipater mounting post passing through a respective one of the third plurality of holes and a respective one of the first plurality of holes to mechanically secure the frame and backplate on opposite sides of the circuit board; and
    a plurality of second fasteners each mechanically engaged to a respective one of the plurality of threaded channels and passing through a respective one of the second plurality of holes to mechanically secure the frame and backplate on opposite sides of the circuit board.

9. The method of claim 8, further comprising guiding a package comprising a processor into the component loading system.

10. The component loading system of claim 9, wherein the package comprises a processor/heat dissipater module comprising a processor mechanically coupled to a heat dissipater.

11. The method of claim 8, further comprising mechanically coupling a heat dissipater to the plurality of heat dissipater mounting posts, each heat dissipater comprising a plurality of spring-loaded fasteners each mechanically coupled to a respective one of the plurality of heat dissipater mounting posts, the spring-loaded fasteners each having a spring force providing mechanical loading for thermally coupling the heat dissipater to a processor electrically coupled to the socket.

12. The method of claim 11, further comprising mechanically securing the processor to the socket by a wire bale retention mechanism.

13. The method of claim 8, further comprising mechanically coupling a processor/heat dissipater module to the plurality of heat dissipater mounting posts, each heat dissipater comprising a plurality of spring-loaded fasteners each mechanically coupled to a respective one of the plurality of heat dissipater mounting posts, the spring-loaded fasteners each having a spring force providing mechanical loading for electrically mating a processor to the socket.

14. An information handling system comprising:
a circuit board comprising:
    a socket;
    a first plurality of holes; and
    a second plurality of holes;
a memory communicatively coupled to the socket;
a frame comprising:
    two opposing sidewalls each substantially perpendicular to a surface of the circuit board coupled to one another via a plate;
    a plurality of threaded channels, each channel adjacent to one of the two opposing sidewalls and located between the two opposing sidewalls; and
    a third plurality of holes;
a backing plate comprising:
    a plurality of heat dissipater mounting posts; and
    a fourth plurality of holes;
a plurality of first fasteners each mechanically engaged to a respective heat dissipater mounting post passing through a respective one of the third plurality of holes and a respective one of the first plurality of holes to mechanically secure the frame and backplate on opposite sides of the circuit board; and a plurality of second fasteners each mechanically engaged to a respective one of the plurality of threaded channels and passing through a respective one of the second plurality of holes to mechanically secure the frame and backplate on opposite sides of the circuit board.

15. The information handling system of claim 14, the sidewalls arranged in relation to each other and the socket in order to mechanically guide a package comprising a processor into the component loading system.

16. The information handling system of claim 15, wherein the package comprises a processor/heat dissipater module comprising a processor mechanically coupled to a heat dissipater.

17. The information handling system of claim 14, wherein each of the plurality of heat dissipater mounting posts are configured to engage with a respective fastener of a heat dissipater.

18. The information handling system of claim 14, further comprising a heat dissipater comprising a plurality of spring-loaded fasteners each mechanically coupled to a respective one of the plurality of heat dissipater mounting posts, the spring-loaded fasteners each having a spring force providing mechanical loading for thermally coupling the heat dissipater to a processor electrically coupled to the socket.

19. The information handling system of claim 18, the heat dissipater integral to a processor/heat dissipater module further comprising a processor mechanically coupled to the heat dissipater, and the spring-loaded fasteners each having a spring force providing mechanical loading for electrically mating the processor to the socket.

20. The information handling system of claim 18, wherein the processor is mechanically secured to the socket by a wire bale retention mechanism.

* * * * *

UNITED STATES PATENT AND TRADEMARK OFFICE
CERTIFICATE OF CORRECTION

PATENT NO. : 9,521,757 B2
APPLICATION NO. : 14/595987
DATED : December 13, 2016
INVENTOR(S) : Lawrence A. Kyle et al.

It is certified that error appears in the above-identified patent and that said Letters Patent is hereby corrected as shown below:

In the Claims

Please amend Claim 9 as follows:
9. The method of Claim 8, further comprising guiding a package comprising a processor into the frame.

Please amend Claim 10 as follows:
10. The method of Claim 9, wherein the package comprises a processor/heat dissipater module comprising a processor mechanically coupled to a heat dissipater.

Please amend Claim 15 as follows:
15. The information handling system of Claim 14, the sidewalls arranged in relation to each other and the socket in order to mechanically guide a package comprising a processor into the frame.

Signed and Sealed this
Eighteenth Day of April, 2017

Michelle K. Lee
*Director of the United States Patent and Trademark Office*